United States Patent
Kudo et al.

(10) Patent No.: US 7,317,604 B2
(45) Date of Patent: *Jan. 8, 2008

(54) OVER-CURRENT PROTECTION DEVICE

(75) Inventors: Takahiro Kudo, Tokyo (JP); Junzo Tanaka, Saitama (JP); Kimitada Ishikawa, Saitama (JP)

(73) Assignee: Fuji Electric Co., Ltd., Kawasaki-Shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/282,716

(22) Filed: Nov. 21, 2005

(65) Prior Publication Data

US 2006/0072272 A1    Apr. 6, 2006

Related U.S. Application Data

(63) Continuation of application No. 10/490,035, filed as application No. PCT/JP02/10438 on Oct. 8, 2002, now Pat. No. 7,031,131.

(30) Foreign Application Priority Data

Oct. 9, 2001    (JP) .............................. 2001-311282

(51) Int. Cl.
 *H02H 3/08* (2006.01)
 *H02H 9/02* (2006.01)
 *H02H 9/00* (2006.01)
 *H02H 9/08* (2006.01)

(52) U.S. Cl. ..................... 361/93.1; 361/54; 361/57; 361/93.9

(58) Field of Classification Search ............... 361/93.1, 361/54, 57, 93.9
 See application file for complete search history.

(56) References Cited

U.S. PATENT DOCUMENTS 5,825,602 A    10/1998    Tosaka et al.
7,031,131 B2 *    4/2006    Kudo et al. ................. 361/93.1

FOREIGN PATENT DOCUMENTS

| CN | 1187620 A | 7/1998 |
|---|---|---|
| EP | 0 669 691 | 2/1994 |
| JP | 63-138258 | 6/1988 |
| JP | H08-285702 | 11/1996 |
| JP | 09-033257 | 2/1997 |
| JP | H09-259733 | 10/1997 |
| JP | 2000-055996 | 2/2000 |

* cited by examiner

*Primary Examiner*—Michael Sherry
*Assistant Examiner*—Dharti H Patel
(74) *Attorney, Agent, or Firm*—Manabu Kanesaka

(57) ABSTRACT

An over-current protection device is constituted of a current detection unit for detecting a current from a power-supply source to a load having a magnetism detection element with a magnetic impedance (MI) effect, an AC-current supply device for supplying an AC current to the detection element, a bias-current supply device for supplying a bias current to a bias coil, a peak detection device for detecting a peak of impedance of the magnetism detection element as a variation of voltage, and a switch corresponding to a phase for selecting an output of the peak detection device. In the current detection unit, a holding device for holding a switch output and an amplifier are disposed in common for detecting the current in each phase, thereby expanding a current detectable range and reducing power consumption and cost.

10 Claims, 17 Drawing Sheets

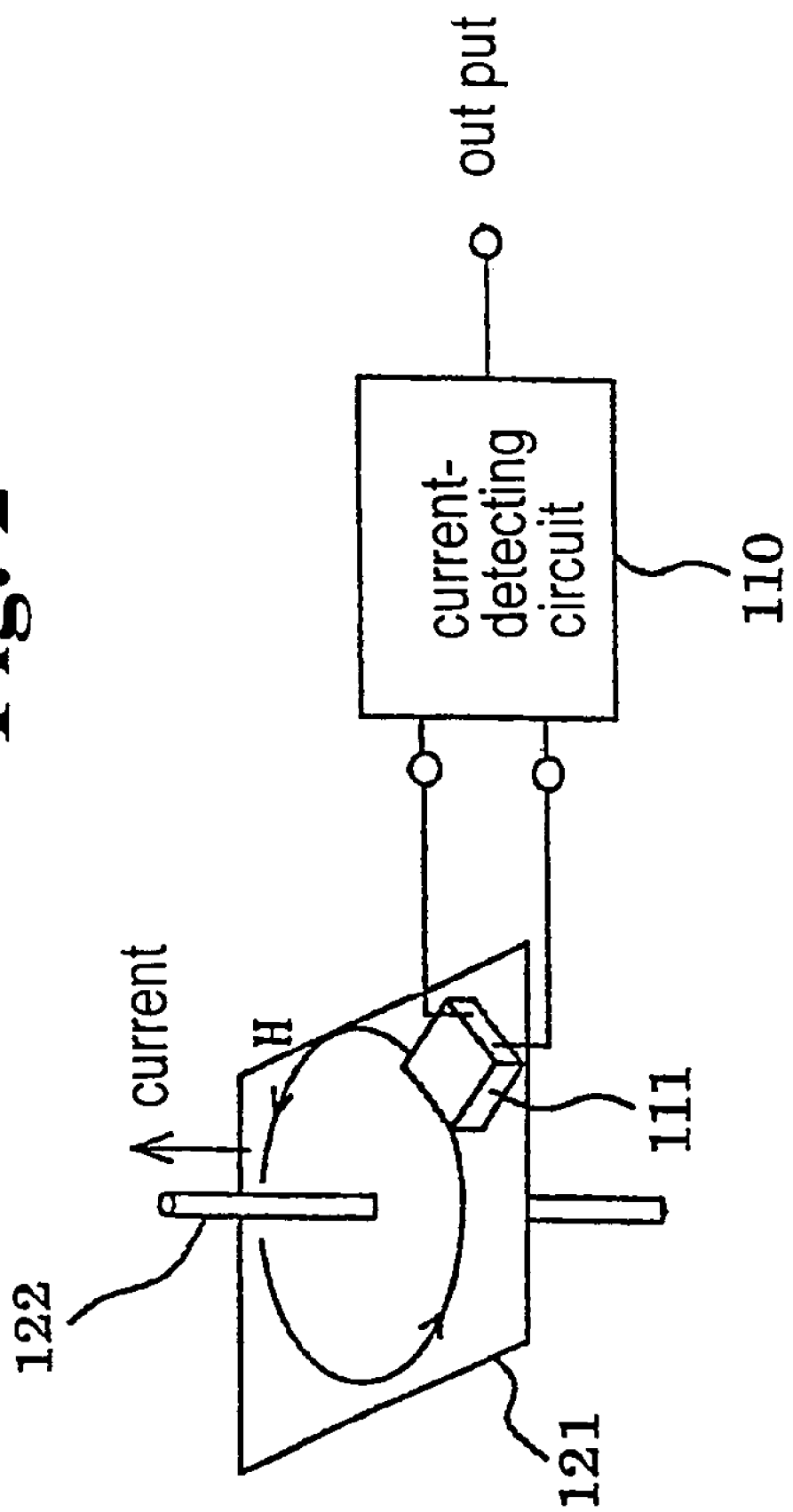

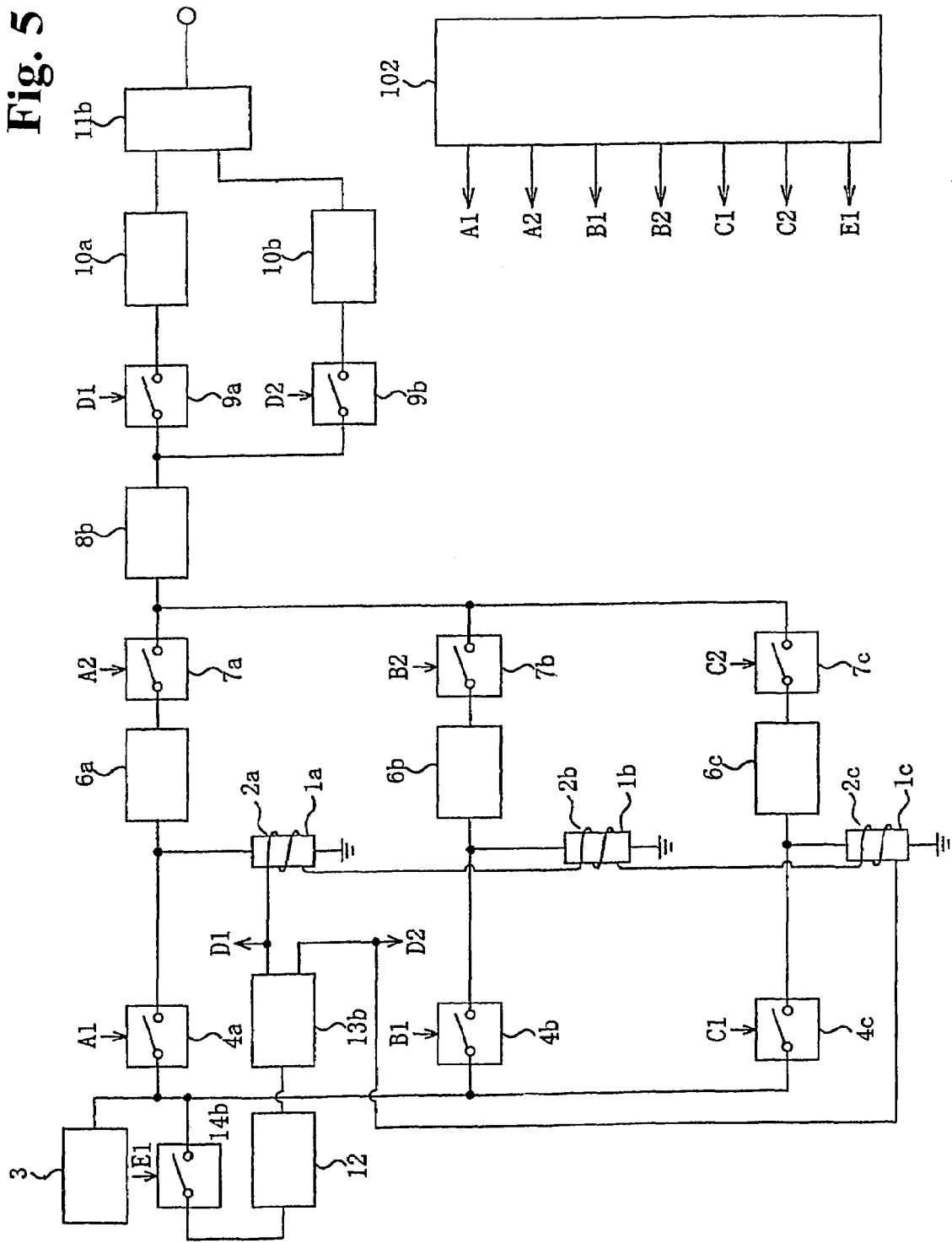

magnetic field generated by current 200 magnetic-field detecting direction of the magnetic impedance element

US 7,317,604 B2

OVER-CURRENT PROTECTION DEVICE

CROSS-REFERENCE TO RELATED APPLICATION

The present application is a continuation application of Ser. No. 10/490,035 filed on Apr. 13, 2004 now U.S. Pat. No. 7,031,131.

TECHNICAL FIELD OF THE INVENTION

The present invention relates to an over-current protection device for detecting a current flowing through a conductor and for shutting off the current when the current exceeds a predetermined threshold value. More particularly, the present invention relates to an over-current protection device capable of controlling power supplied to a load such as an electric motor.

DESCRIPTION OF TECHNICAL BACKGROUND

An over-current protection device detects a current flowing through a load such as a three-phase motor via a contactor, and shuts off the current flowing to the motor when the current exceeds a safe threshold value. Conventionally, such a device is provided with a bi-metal switching element, and a part or all of the current to the motor flows through the bi-metal switching element. That is, the current flows though a switch consisting of the bi-metal element so that the bi-metal element is heated according to an intensity of the current. When the motor current exceeds a safe threshold value for a period of time longer than a predetermined time, the bi-metal element bends due to the heat to hold a switch contact in an open state, thereby shutting off the power to a control input terminal of a contactor. However, in the device using the bi-metal switch, it is difficult to adjust the current in the state that the switch is opened, so that the incorrectly adjusted condition tends to continue for a long time.

On the other hand, when an electric device is used instead of the bi-metal element, it is possible to electronically perform the function of the bi-metal switch. Accordingly, it is possible to improve reliability and easily adjust the device. However, the electronic device includes a complex circuit, and in order to properly detect a current to operate a contactor, it is necessary to provide a constant-voltage power supply and a large number of components. In addition, a current detection transformer has been used as a device for detecting current. Accordingly, it is difficult to obtain a wide range for detecting a current due to magnetic saturation of an iron core. It is possible to provide a magnetoresistive element as a device for detecting a current. However, it is necessary to provide an iron core due to a low sensitivity of the magnetoresistive element. Accordingly, similar to the current detection transformer, it is difficult to obtain a wide range for detecting a current.

To solve these problems, as a high sensitive magnetism detection element for replacing a Hall element and the magnetoresistive element, a magnetic impedance element using an amorphous wire has been disclosed (refer to Patent Document 1). Further, an amorphous magnetic thin film formed via a sputtering method has been used (refer to Patent Document 2).

When one of the magnetic impedance elements is used, it is possible to obtain high sensitivity in the magnetism detection characteristic. However, as shown in FIG. 17, impedance changes non-linearly relative to a magnetic field of the amorphous wire element, so that the magnetic impedance element has a non-linear output of the magnetism detection characteristic (refer to Patent Document 3). Accordingly, the linear output relative to the magnetic field is obtained from a difference in a variation of the magnetic impedance element obtained from a sum of the positive and negative magnetic fields generated by the AC bias magnetic field and the immeasurable external magnetic field, so that an AC bias magnetic field is applied to the magnetic impedance element (refer to Patent Document 4).

[Patent Document 1]
Japanese Patent Publication (Kokai) No. 06-281712 (page 4, FIG. 5 to FIG. 12)

[Patent Document 2]
Japanese Patent Publication (Kokai) No. 08-075835 (pages 4 to 5, FIG. 1 to FIG. 6)

[Patent Document 3]
Japanese Patent Publication (Kokai) No. 2000-055996 (page 3, FIG. 23)

[Patent Document 4]
Japanese Patent Publication (Kokai) No. 09-127218 (pages 4 to 5, FIG. 3)

Incidentally, in principle, the magnetic impedance element generates a magnetic impedance effect. Accordingly, it is necessary to apply a high-frequency current of several mA and at least several MHz to the element, thereby increasing the power consumption and a size of the power-supply transformer, and making it difficult to downsize the device and reduce cost of the device.

FIG. 16 shows an example of a conventional detecting circuit using the magnetic impedance element. The circuit includes sheared oscillating means 31 and bias-current applying means $13a1$. A current of several mA and a bias current of about several tens of mA are constantly applied to magnetism detection elements $1a$, $1b$, and $1c$, thereby increasing the power consumption in proportion to the number of the elements. Further, it is necessary to provide wave detection means $6a1$, $6b1$, and $6c1$; holding means $8a1$, $8b1$, and $8c1$; and amplifying means $11a1$, $11b1$, and $11c1$ in proportion to the number of the magnetism detection elements, thereby increasing a size of the circuit and cost of the parts.

In view of the problems, the present invention has been made, and an object of the present invention is to provide an over-current protection device with a compact and low cost configuration having a low-cost power-supply source in which a constant-voltage regulated power-supply is not necessary. Further, it is possible to obtain a wide range of the current detection.

SUMMARY OF THE INVENTION

To solve the problems described above, according to a first aspect of the present invention, an over-current protection device for shutting off power supply to a load when an over-loaded-current is generated includes a switching unit for switching a current supplied from a power-supply source to the load; a current detector for detecting the current supplied from the power-supply source to the load; and a controlling power-supply source for supplying power to each of the component elements. The current detector includes a magnetism detection element corresponding to a phase of the power-supply source and having a magnetic impedance effect; AC-current supply means for supplying an AC current to the magnetism detection element via oscillating means and a first switch corresponding to the magnetism detection element; bias-current supply means formed of a bias coil wound on the magnetism detection element, a third switch, and bias-current applying means for supplying a current to the bias coil via the third switch; wave detection means corresponding to the magnetism detection element for converting an individual impedance variation into a voltage and for passing a peak of the converted voltage the wave detection means; a second switch corresponding to the wave detection means for selecting an output of the wave detection means; holding means for holding the selected output of the wave detection means; and amplifying means for amplifying the voltage held by the holding means. It is possible to detect the current for each phase based on the selective operation of the first through third switches.

According to a second aspect of the present invention, an over-current protection device for shutting off power supply to a load when an overloaded current is generated includes a switching unit for switching a current supplied from a power-supply source to the load; a current detector for detecting the current supplied from the power-supply source to the load; and a controlling power-supply source for supplying power to each of the component elements. The current detector includes a magnetism detection element having a magnetic impedance effect and corresponding to a phase of the power-supply source; AC-current supply means for supplying an AC current to the magnetism detection element via oscillating means and a first switch corresponding to the magnetism detection element; bias-current supply means formed of a bias coil wound on the magnetism detection element, bias-current applying means, and dividing means connected to the oscillating means via a third switch for dividing a signal output from the oscillating means for feeding a current having a different polarity to the bias coil based on first and second timings; wave detection means corresponding to the magnetism detection element for converting an impedance variation into a voltage and for passing a peak of the voltage; a second switch corresponding to the wave detection means for selecting a signal output from the wave detection means; a first holding means for holding the selected signal output from the wave detection means; a pair of fourth switches for selecting the held voltage based on the first and second timings; a pair of second holding means for holding the selected two voltages; and amplifying means for amplifying a difference in the signals output from the pair of the second holding means. It is possible to detect the current for each phase based on the selective operation of the first through fourth switches.

In the first and second aspects of the present invention, when the first switch and the second switch corresponding to the magnetism detection element disposed in the phase of the power-supply source are selected, it is possible to select the third switch (according to a third aspect of the present invention). Alternatively, it is possible to operate the oscillating means synchronous with the third switch (according to a fourth aspect of the present invention).

In the first and second aspects of the present invention, the controlling power-supply source may include at least a pair of power-supply transformers having a primary coil and a secondary coil and connected to a current supply line from the controlling power-supply source to a load; a storage battery for storing the current at a secondary side; and a voltage adjuster (according to a fifth aspect of the present invention). Alternatively, the controlling power-supply source may include a power-supply transformer having at least a pair of primary coils and a secondary coil and connected to a current supply line between the power-supply source and the load; a storage battery for storing the current at a secondary side; and a voltage adjuster (according to a sixth aspect of the present invention). In the sixth aspect of the present invention, at least a pair of the primary coils and the secondary coil may be wound on a single iron core, and the primary coils may have different winding turns according to the phase (according to a seventh aspect of the present invention). In the seventh aspect of the present invention, a pair of the primary coils provided in the power-supply transformers may have a winding ratio of 1:2 (according to an eighth aspect of the present invention).

Further, in the first and second aspects of present invention, it is possible to integrate the magnetism detection element, a terminals for applying an AC current to the magnetism detection element, the bias coil, and a terminal for feeding a bias current to the bias coil with a resin molding process (according to a ninth aspect of the present invention). Alternatively, it is possible to integrate the magnetism detection element, a terminal for applying an AC current to the magnetism detection element, the bias coil, a terminal for feeding a bias current to the bias coil, and a circuit for outputting a signal proportional to the signal output from the magnetism detection element with a resin molding process (according to a tenth aspect of the present invention). Alternatively, it is possible to use a thin-film device as the magnetism detection element (according to an eleventh aspect of the present invention).

That is, in the present invention, the magnetism detection element having the magnetic impedance (MI) effect is used as the current detection means to prevent magnetic saturation caused by an iron core in a widely used conventional current detection transformer, thereby increasing a range of the current detection. Further, the controlling power-supply source does not need external power supply from a constant-voltage regulated power source. As a result, it is possible to provide an over-current protection device having wide applicability and is capable of decreasing the total cost.

When a multi-phase AC power-supply source is used, it is not necessary to provide a power-supply transformer for each phase, thereby providing the over-current protection device with a smaller number of parts and low cost. In this case, the oscillating means is a single unit instead of several oscillating means for each phase in the conventional method. It is possible to apply the AC current to the elements and devices disposed for each phase only when selected. Accordingly, it is possible to decrease power consumption. When the power is supplied to the bias coils only upon the detection, it is possible to further reduce the power consumption is further lowered by solely. When the oscillating means is operated only upon the detection, it is possible to further reduce power consumption.

Further, it is possible to provide only a single system of the holding means and the amplifying means, thereby further reducing power consumption and cost. The positive and negative bias magnetic fields are alternately applied to the magnetism detection element, and a difference in the detected voltages at the time of applying the bias magnetic field is determined. Accordingly, it is possible to improve linearity of the output. Further, a pulse is used to drive intermittently in place of the conventional AC biasing system, thereby further reducing power consumption.

In addition, the magnetism detection element, AC-current input terminal thereof, bias coil, and current input terminal thereof are integrated with a resin molding process, thereby decreasing the magnetic resistance and bias current and reducing a size. Further, the magnetism detection element, AC-current input terminal thereof, bias coil, current input terminal thereof, and circuit for outputting a signal proportional to the signal output from the magnetism detection element are integrated, thereby improving the S/N (signal-to-noise) ratio. In particular, various corrective data are incorporated in the system to improve the function thereof, thereby obtaining excellent environmental resistance, high precision, and lower power consumption. The thin-film device is used as the magnetism detection element, thereby eliminating the adverse influence of variable output caused by a strain in the wire-type element and reducing power consumption with high precision.

BRIEF DESCRIPTION OF THE DRAWINGS

FIG. 2 is a schematic view of a magnetism detection unit;

FIG. 3b is a time chart showing an operation of each of switches shown in FIG. 3a;

FIG. 3d is a partial view showing a modified example of the magnetism detection unit shown in FIG. 3a;

FIG. 4 is a schematic block diagram showing individual components shown in FIG. 3a;

FIG. 5 is a schematic block diagram of a second embodiment of the magnetism detection unit;

DETAILED DESCRIPTION OF PREFERRED EMBODIMENTS

Figure 1:
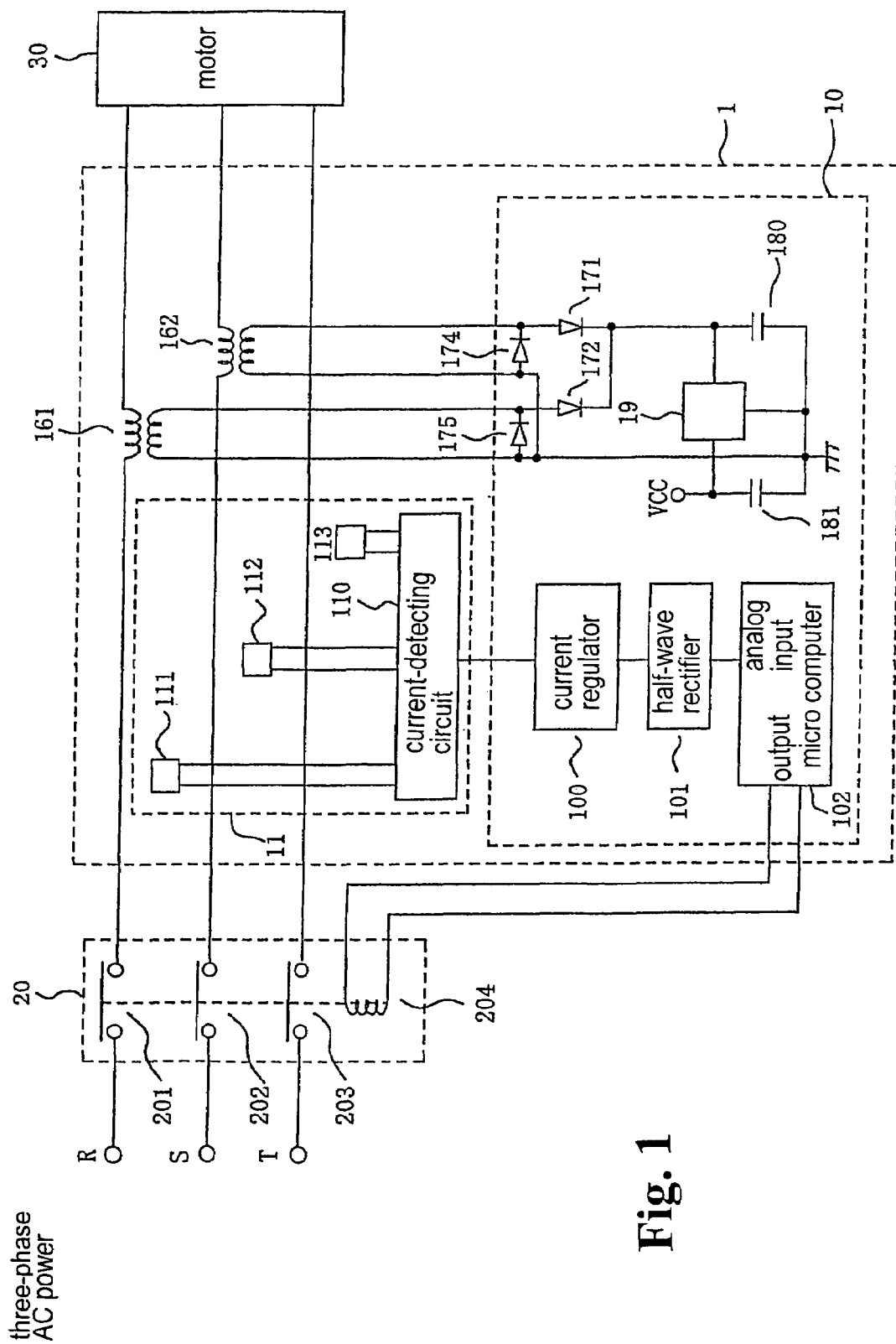
FIG. 1 is a schematic block diagram of an over-current protection device according to a first embodiment of the present invention.

Hereunder, the present invention will be described. FIG. 1 is a schematic block diagram of an over-current protection device according to a first embodiment of the present invention.

In FIG. 1, power-supply lines R, S, and T connected to a three-phase AC power-supply source (not shown) are linked with a motor 30 via a three-phase contactor 20 and a pair of power-supply transformers 161 and 162. A current detection unit 11 detects a current supplied via the power-supply lines R, S, and T for each phase. Even when one of the three phases incurs disconnection, it is required that the entire system be operated normally. Accordingly, the embodiment includes a pair of power-supply transformers 161 and 162. However, the transformer may be disposed for each phase. The contactor 20 has three contacts 201, 202, and 203, and each of the contacts is directly connected to the motor 30, or individually connected via primary coils of the power-supply transformers 161 and 162 through the power-supply lines R, S, and T. The three contacts are mechanically united with each other, so that an electro-magnetic coil 204 connected to a control circuit 10 can drive the three contacts simultaneously. The above-mentioned current detection unit 11, a pair of power-supply transformers 161 and 162, and the control circuit 10 constitute an electronic overload relay unit 1. A current regulator (gain adjuster) 100 amplifies a signal output from the current detection unit 11 in correspondence with a preset current value. The signal output from the current detection unit 11 is sent to an analog input of a microcomputer (mi-con) 102 via a half-wave rectifier 101.

In the controlling power-supply source shown in FIG. 1, a first capacitor 180 is connected to the secondary coils of the power-supply transformers 161 and 162 via a pair of rectifying diodes 171 and 172. Protecting diodes 174 and 175 are respectively linked between an anode and a ground of the circuit. The first capacitor 180 is linked between a positive input of a voltage adjuster 19 and the ground of the circuit. A second capacitor 181 is linked between a positive output and the ground of the circuit, so that the voltage adjuster 19 to output a constant voltage level VCC as a power-supply source of the electronic overload relay unit 1.

FIG. 2 is a view showing a configuration of a current detection unit. Reference numeral 111 shown in FIG. 2 designates a magnetic impedance element (MI element), 122 designates a wiring for supplying a current to each phase, 121 designates a substrate for fixing the wiring and the MI element 1, and 110 designates a detection circuit.

The MI element 111 may include one formed of an amorphous wire disclosed in Japanese Patent Publication (Kokai) No. 06-281712, and a thin film device disclosed in Japanese Patent Publication (Kokai) No. 08-075835. FIG. 2 shows the MI element corresponding to a single phase, and each phase has an identical constitution.

Figure 3A:
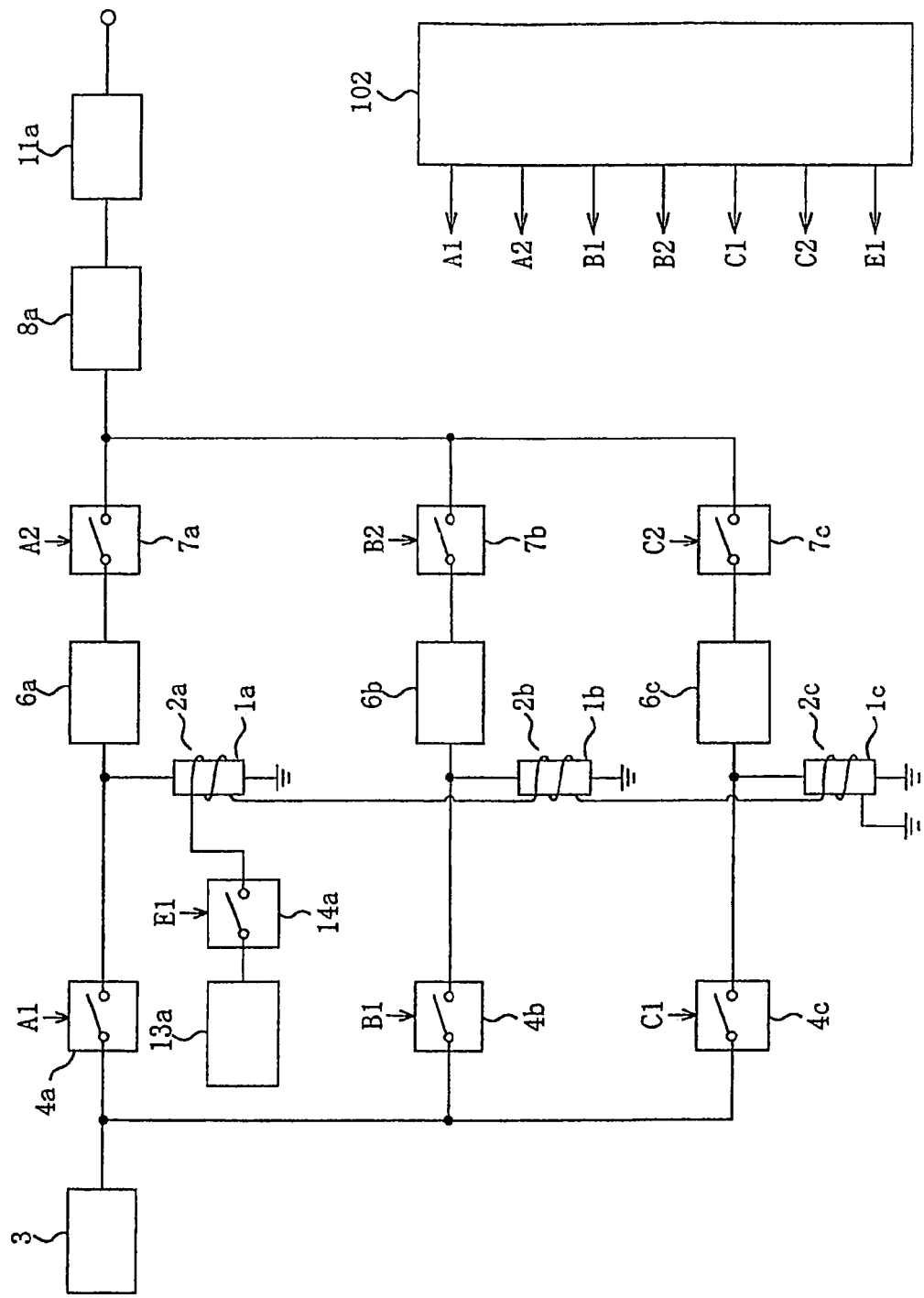
FIG. 3a is a schematic block diagram of a first embodiment of a magnetism detection unit.

FIG. 3a is a view showing a first embodiment of the current detection unit. Reference numerals 1a, 1b, and 1c respectively designate an MI element formed in a wire shape or a thin-film. Reference numerals 2a, 2b, and 2c respectively designate a bias coil for feeding a bias to the MI elements 1a, 1b, and 1c. Reference numeral 3 designates an oscillating circuit. Reference numerals 4a, 4b, and 4c respectively designate a first switch. The first switches 4a, 4b, and 4c individually switch a signal output from the oscillating circuit 3, and then apply a high-frequency AC current to the MI elements 1a, 1b, and 1c. Reference numeral 13a designates second current-applying means for feeding a current to the bias coils 2a, 2b, and 2c, and a third switch 14a turns on and off the current. Reference numerals 6a, 6b, and 6c respectively designate wave-detecting means for outputting a peak value of varied impedance of the MI elements 1a, 1b, and 1c converted into varied voltages. Reference numerals 7a, 7b, and 7c respectively designate a second switch for extracting a signal output from the wave detection means in correspondence with the selected MI element. Reference numeral 8a designates first holding means for holding the signal output from the wave detection means 6a, 6b, and 6c. Reference numeral 11a designates amplifying means for amplifying the signal output from the first holding means 8a.

In response to the control signals A1, A2, B1, B2, C1, and C2 for the first switches 4a, 4b, and 4c and the second switches 7a, 7b, and 7c, the microcomputer 102 selects one of the MI elements 1a, 1b, and 1c, and further outputs a control signal E1 for delivering a bias current.

More particularly, in response to the control signals A1 or A2, the MI element 1a is selected. Likewise, in response to the control signals B1 or B2, the MI element 1b is selected. Likewise, in response to the control signals C1 or C2, the MI element 1c is selected. In addition, in response to the control signal E1, a bias current is delivered to one of the MI elements 1a, 1b, and 1c. Accordingly, it is possible to apply the AC current and bias current to the MI elements consuming the majority of power solely for a period of time when the control signal is, thereby reducing the consumed power. For example, when the MI element 1a is driven, the first switch 4a and second switch 7a are turned on at substantially the same time, and the control signal E1 is simultaneously output only once to turn on the third switch 14a, thereby reducing power consumption. Further, the first holding means 8a and the amplifying means 11a can be constituted in a single system, thereby further facilitating power consumption and lower cost.

Figure 3B:
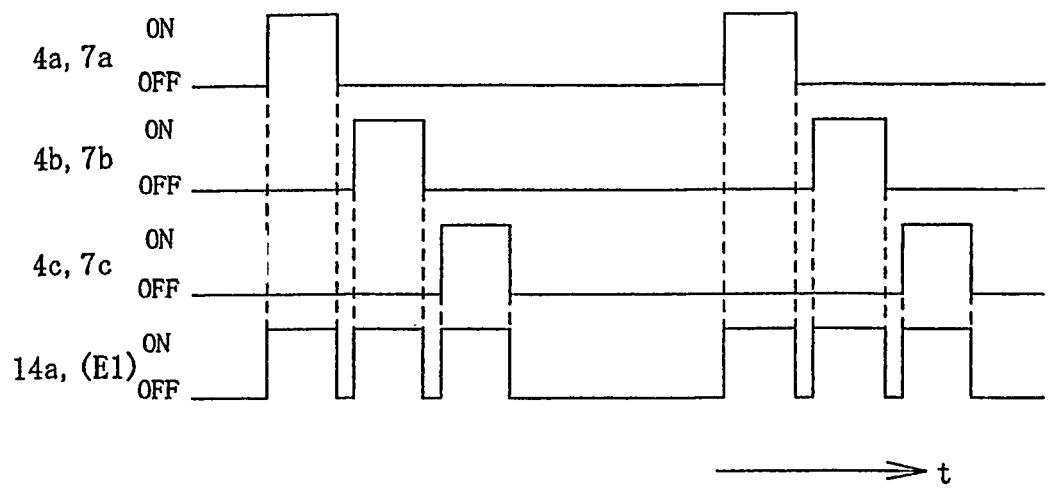

In terms of the timing after the MI element 1a is operated, the first switch 4b and second switch 7b are turned on at substantially the same time. The control signal E1 is simultaneously output only once to turn the third switch 14a on, thereby turning on the MI element 1b to further turn on the first switch 4c and the second switch 7c at substantially the same time. Simultaneously, the control signal E1 is output only once to turn on the third switch 14a, thereby activating the MI element 1c. FIG. 3b is a timing chart showing the above sequential operations.

Figure 3C:
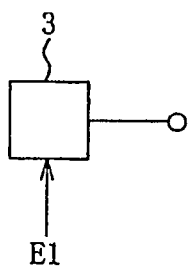
FIG. 3c is an explanatory view of an operating timing of oscillating means.

As shown in FIG. 3c, the oscillating means 3 is activated based on the timing of operating the third switch in response to the control signal E1. Accordingly, the oscillating means 3 can execute an oscillating operation only when a bias current is fed to the bias coils 2a, 2b, and 2c. As a result, as compared with a case that the oscillating means 3 continuously executes the oscillating operation, it is possible to further reduce power consumption.

Figure 3D:
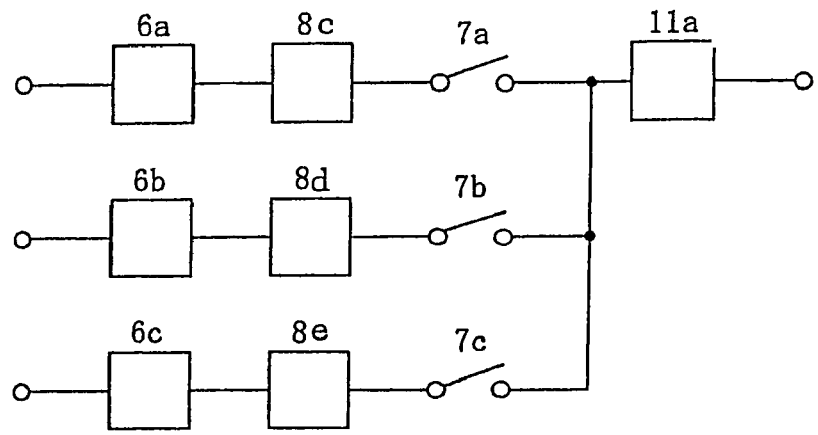
Figure 3E:
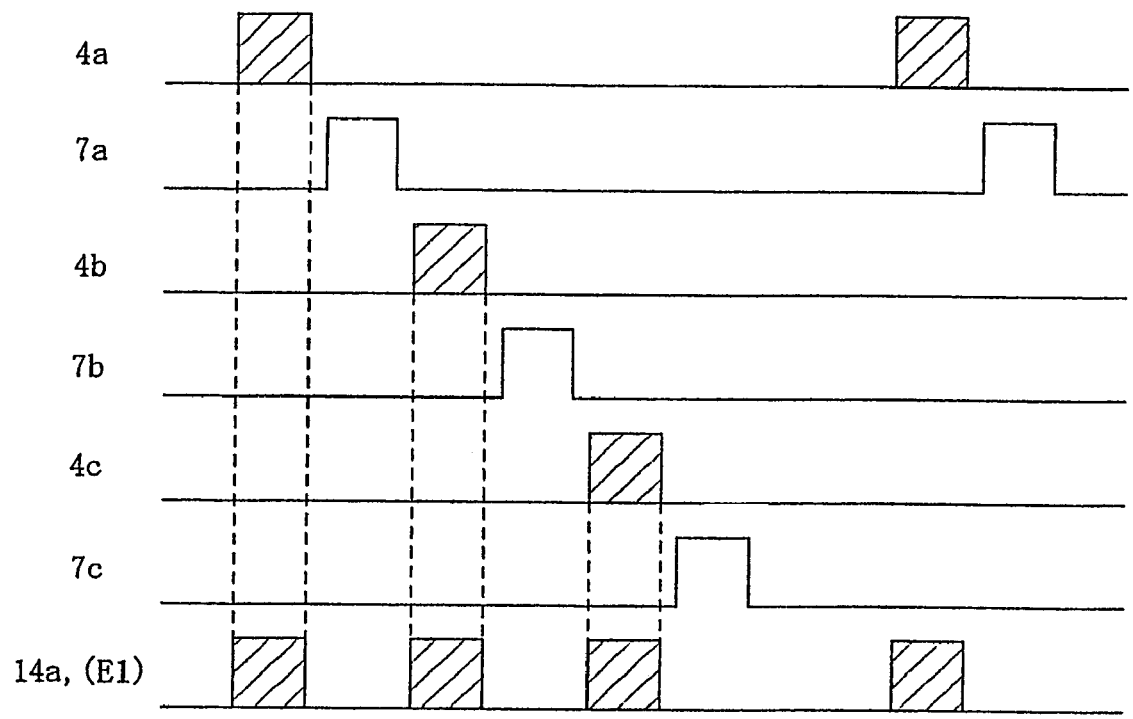
FIG. 3e is a time chart showing an operation of the modified example shown in FIG. 3d.

FIG. 3d shows a modified example of the device shown in FIG. 3a. The holding means 8a is provided in common with the wave detection means 6a, 6b, and 6c shown in FIG. 3a. As shown in FIG. 3d, the holding means 8c, 8d, and 8e is individually provided in the wave detection means 6a, 6b, and 6c, respectively. As in the case shown in FIG. 3a, the first switch and the third switch are turned on at substantially the same time. However, with the above arrangement, it is possible to select the operating timing. Incidentally, the second switches 7a, 7b, and 7c are integrated. FIG. 3e is a timing chart of the integrated unit.

Figure 4:
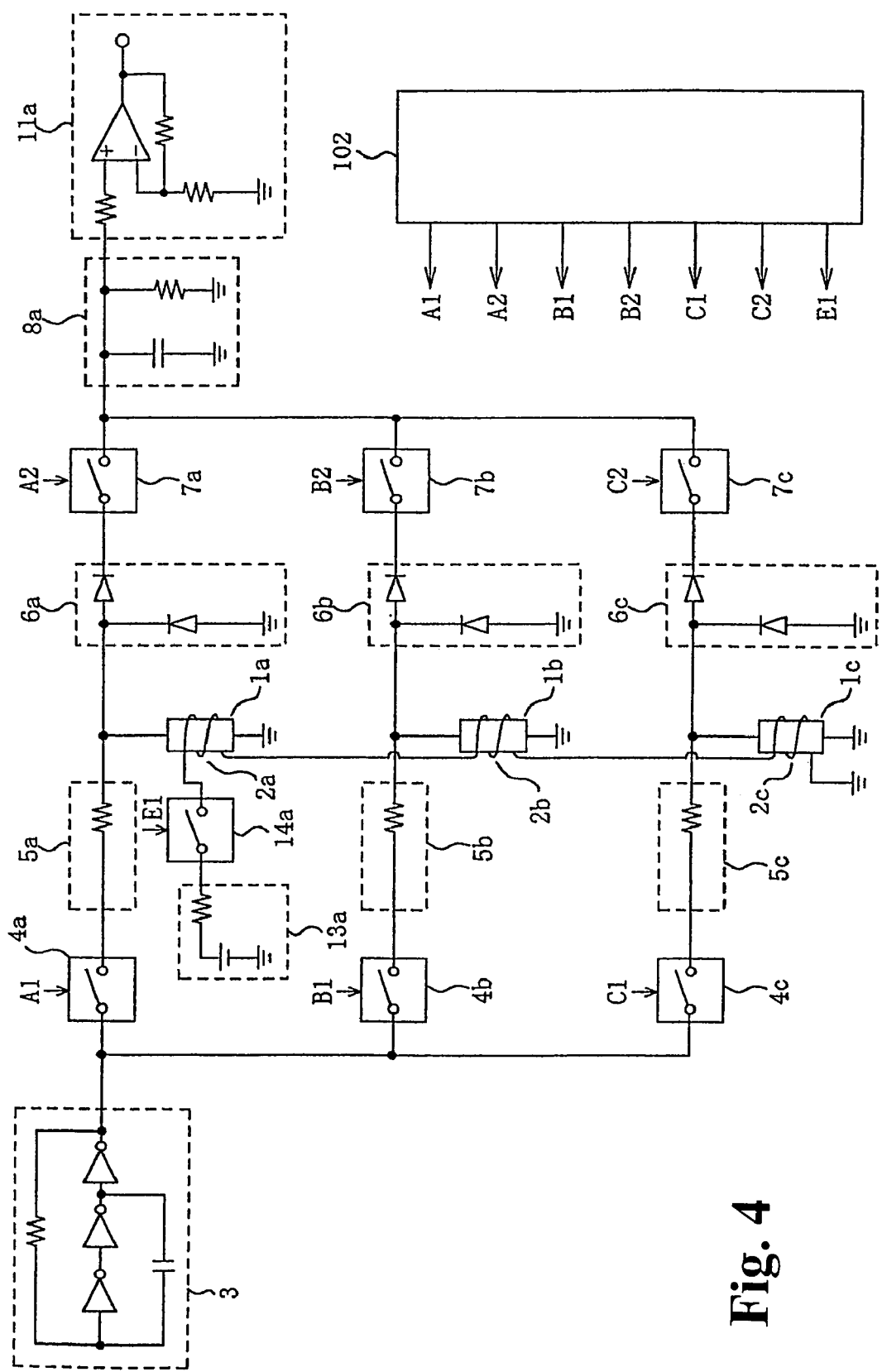

FIG. 4 is a view showing an embodiment of the device shown in FIG. 3a. The oscillating means 3 may include a quartz oscillator or transistor, and in this embodiment, the oscillating means 3 is formed of a CMOS gate as an example. The wave detection means 6a, 6b, and 6c may be formed of analog switches, and in this embodiment, the wave detection means 6a, 6b, and 6c are formed of diodes. The first holding means 8a is formed of a resistor and capacitor. The amplifying means 11a may be formed of a transistor, and in the embodiment, the amplifying means 11a is formed of an operational amplifier as an example. The first, second, and third switches are respectively formed of relays or analog switches. For the purpose of lowering the current fed to the MI elements 1a, 1b, and 1c, current limit resistors 5a, 5b, and 5c are provided. However, the current limit resistors may be omitted.

Figure 17:
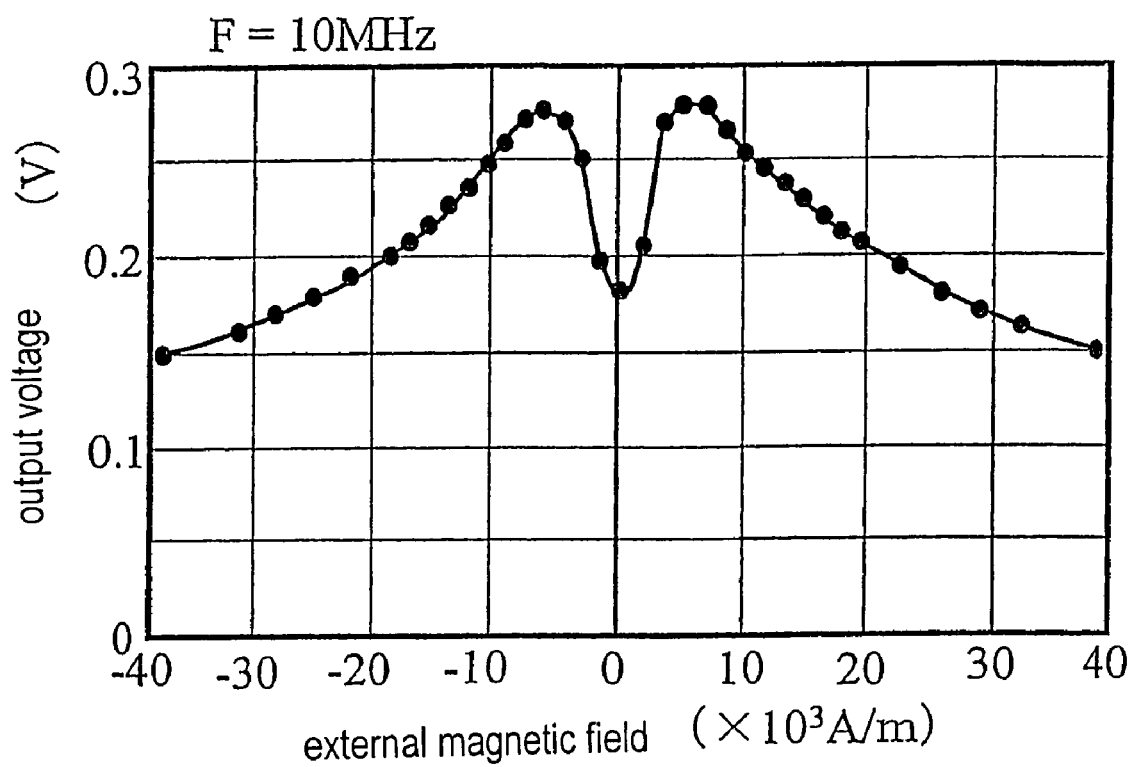
FIG. 17 is an explanatory view showing magnetic impedance characteristic of an amorphous wire.

The diagrams shown in FIG. 3a and FIG. 4 can detect magnetism with a simplified constitution. However, a variation in impedance relative to a magnetic field of the amorphous wire elements exhibits non-linearity as shown in FIG. 17, so that the output precision is not satisfactory.

FIG. 5 is a view showing a second embodiment with an improvement in the non-linear characteristic. As compared with that shown in FIG. 3a, the positive and negative bias magnetic fields are alternately applied to the MI elements 1a, 1b, and 1c, so that a difference in detected voltages upon the application of the individual bias magnetic fields is obtained, thereby improving the output linearity.

Reference numeral 12 designates frequency-dividing means for dividing a frequency of the signal output from the oscillating means 3. The dividing means 12 outputs a signal containing a frequency lower than that of the AC current fed to the MI elements 1a, 1b, and 1c. Reference numeral 13b designates second current-applying means for alternately applying positive and negative bias magnetic fields in response to the positive and negative output timings delivered from the frequency-dividing means 12. The second current-applying means 13b applies the output signal of the oscillating means 3 divided by the frequency-dividing means 12 via the third switch 14b to the bias coils 2a, 2b, and 2c. Further, the device is provided with first holding means 8b for holding a voltage corresponding to a variation in impedance caused by the positive and negative bias magnetic fields of the MI elements 1a, 1b, and 1c; a pair of second holding means 10a and 10b for holding the voltage output from the first holding means 8b based on the positive and negative timings; a pair of fourth switches 9a and 9b operated by the timings D1 and 2; and differential amplifying means 11b for differentially amplifying the voltage output from the second holding means 10a and 10b.

FIG. 6 is an explanatory view showing an operation of the positive and negative biases. Note that the operating characteristic of the sensor (i.e. the MI elements) relative to the magnetic field shown in FIG. 6 is that in a conventional magnetic impedance element.

Figure 6A:
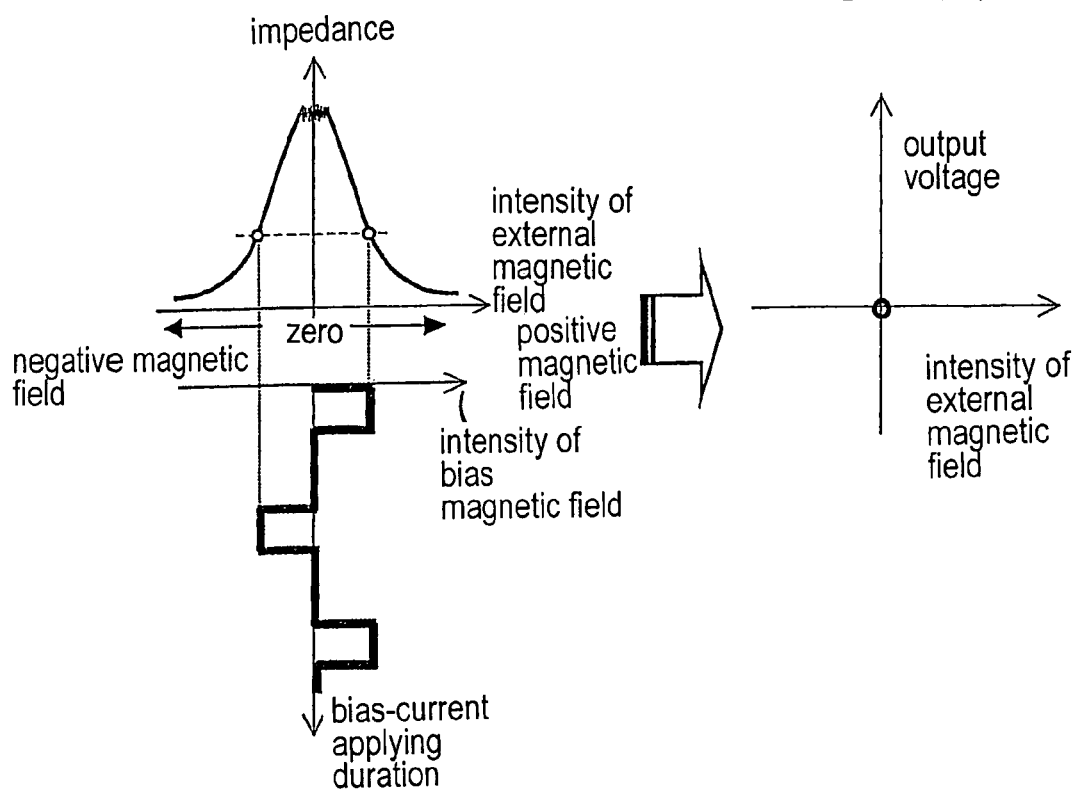
FIG. 6(a)–6(d) is an explanatory view showing positive and negative biases.

FIGS. 6(a) and (b) are explanatory views of the operating characteristic when the bias magnetic field is added while the external magnetic field remains zero. FIG. 6(a) schematically shows the operating characteristic when the bias magnetic field having an equal intensity of the positive and negative magnetic fields is added to a magnetic impedance element under the condition that no appreciable external magnetic field out of the measurable range is present. FIG. 6(a) also shows a portion representing a variation in impedance relative to a variation in the intensity of the external magnetic field, and variations caused by the intensity of the bias magnetic field added to the magnetic impedance element and the adding duration.

The impedance characteristic does not show a smooth curve in an area in which the intensity of the external magnetic field remains zero. In general, the impedance characteristic becomes unstable at a point where the polarity of the magnetic field changes. The blank circles shown on the impedance-characteristic curves designate the impedance values acquired from the values of the maximum positive/negative bias magnetic fields generated by the bias magnetic field that periodically oscillates the positive and negative magnetic fields with a rectangular waveform.

Based on the relationship between the values and the high-frequency current available for the driving applied to the magnetic impedance element, an output voltage can be obtained. The difference in output voltages between the two points is detected.

Figure 6B:
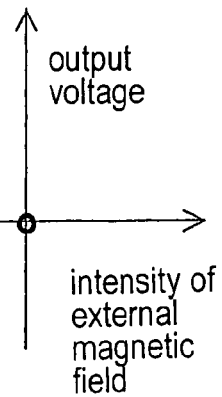

As a result, in a case of no appreciable external magnetic field at outside of the measurable range, the output voltages at two points are identical, i.e. no difference, so that the output becomes zero after the differential amplifying operation as shown in FIG. 6(b).

Figure 6C:
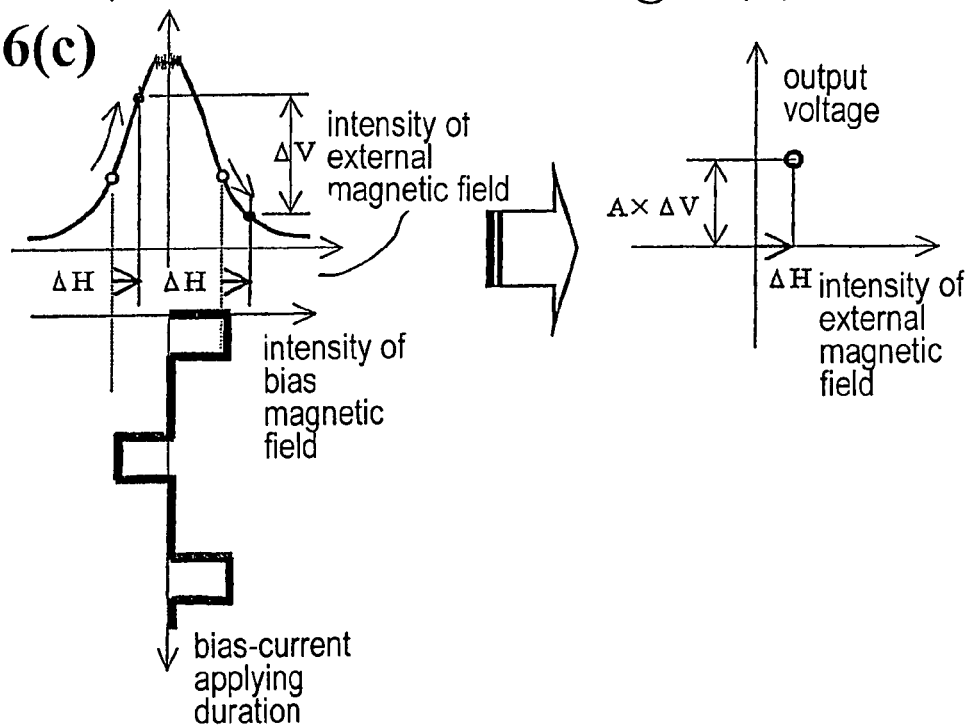

On the other hand, FIGS. 6(c) and (d) are views showing an operation of applying the bias when a measurable external magnetic field exists.

FIG. 6(c) presents a schematic chart showing the characteristic in a case that positive magnetic field of ΔH is detected as the external magnetic field outside the measurable range. Blank circles shown on the curves for designating the impedance characteristic respectively represent the impedance values obtained from the maximum values of the positive and negative magnetic fields of bias. The blank circles shift to the closed circles due to the influence of the external magnetic field ΔH. Relative to the closed circles at the positive side and the negative side of the oscillating bias magnetic field, the polarity of the voltage is defined by the direction that a voltage value corresponding to the closed circles at the negative side changes the closed circles at the positive side.

Figure 6D:
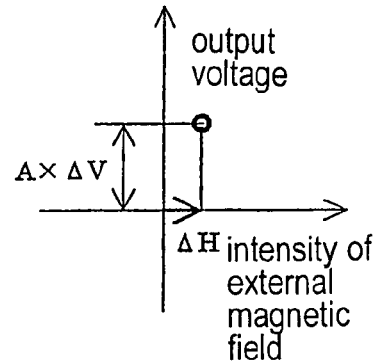

Accordingly, the difference in the output voltages (differential output) becomes ΔV of the positive voltage. When an external magnetic field at outside of the measurable range ΔH is detected, as shown in FIG. 6(d), the output after the differential amplifying operation is obtained as A×ΔV, in which A is an amplifying rate of the differential amplifier.

As described above, instead of the conventional AC bias driving, by intermittently driving the magnetic impedance elements with pulses as shown in FIGS. 6(a) and 6(c), it is possible to further reduce power consumption as compared with the conventional method of driving continuously.

Figure 7:
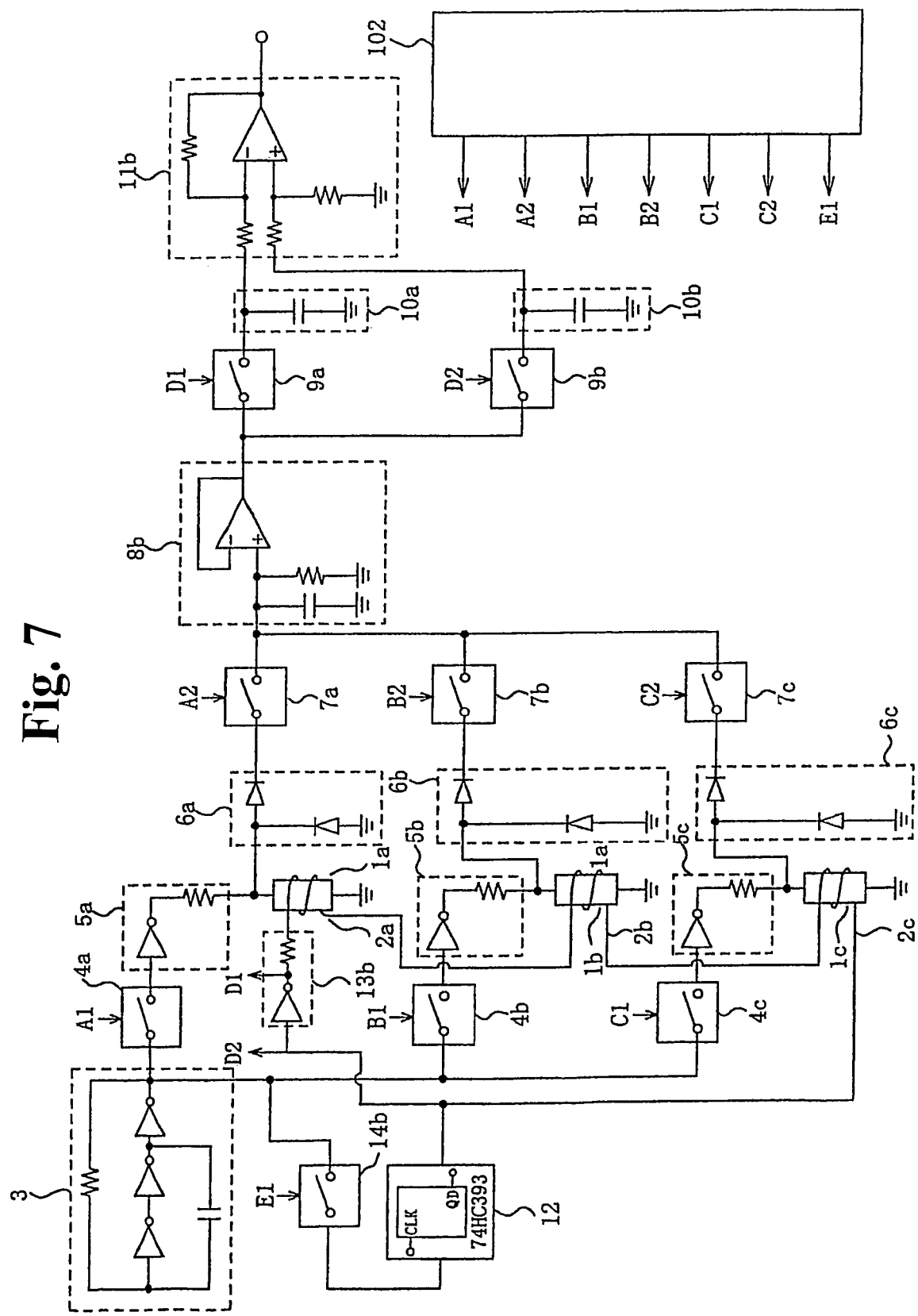
FIG. 7 is a schematic block diagram showing individual components shown in FIG. 5.

FIG. 7 is a view showing an example of the device shown in FIG. 5. In contrast with that shown in FIG. 4, the circuit shown in FIG. 7 corresponds to that provided with second holding means 10a and 10b, differential amplifying means 11b, and frequency-dividing means 12. In this example, the second holding means 10a and 10b are formed of capacitors. The differential amplifying means 11b is formed of a differential amplifier of an operational amplifier. The frequency-dividing means 12 is formed of a flip-flop.

Figure 8:
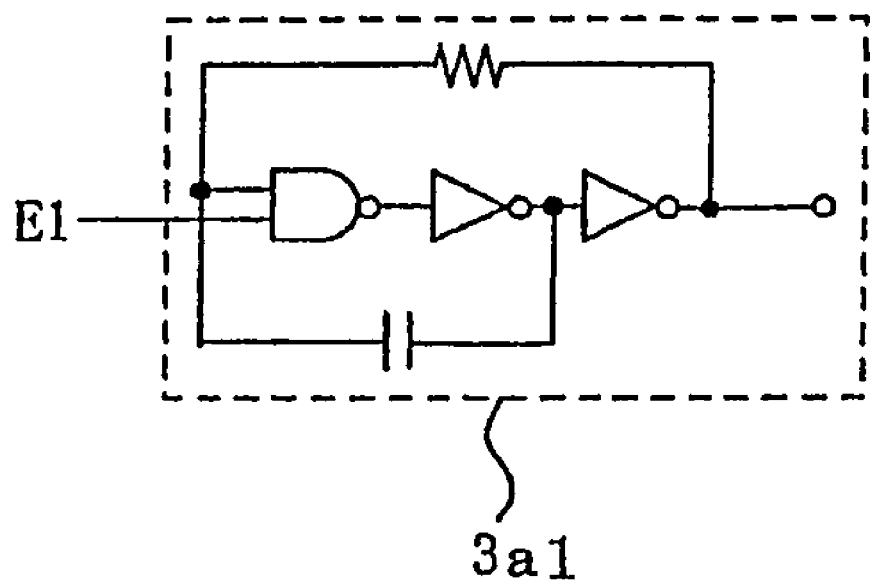
FIG. 8 is a view showing a circuit of another embodiment of the oscillating means.

In place of the oscillating means 3 shown in FIG. 4 and FIG. 7, as shown in FIG. 8, one (3a1) capable of oscillating only when the control signal E1 remains at a High level may be used, so that the third switch 14b and the oscillating means 3a1 are turned on via the signal E1 only when one of the groups including the first switches 4a, 4b, and 4c, and the second switches 7a, 7b, and 7c corresponding to each power-source phase is turned on, thereby further reducing power consumption.

The above description refers to a case in which the three-phase AC power-supply source is used. In a case of a single phase, only the single phase is considered to employ the invention.

Figure 9:
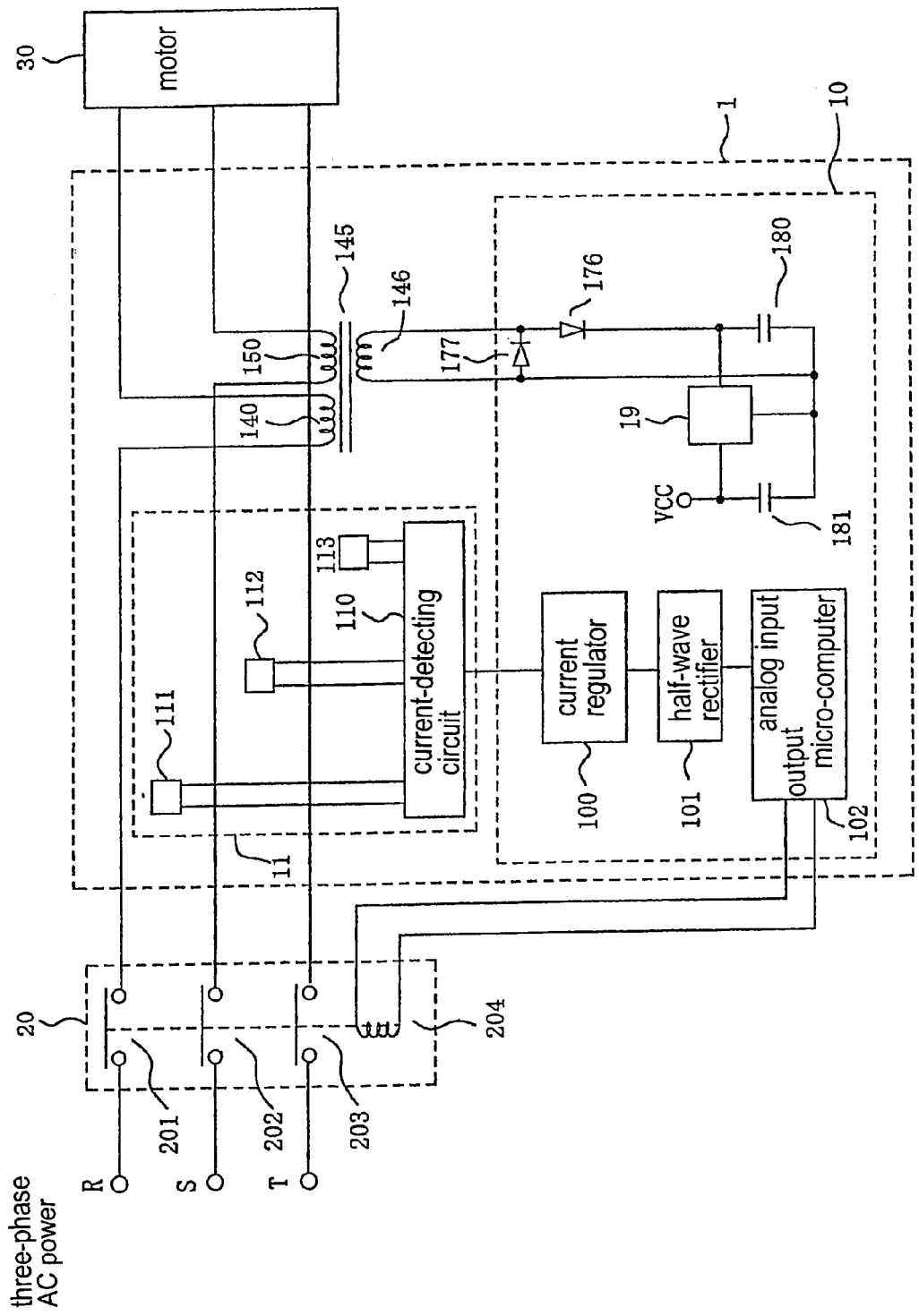
FIG. 9 is a schematic block diagram of an over-current protection device according to a second embodiment of the present invention.

FIG. 9 is a schematic block diagram of an over-current protection device according to a second embodiment of the present invention.

Figure 10:
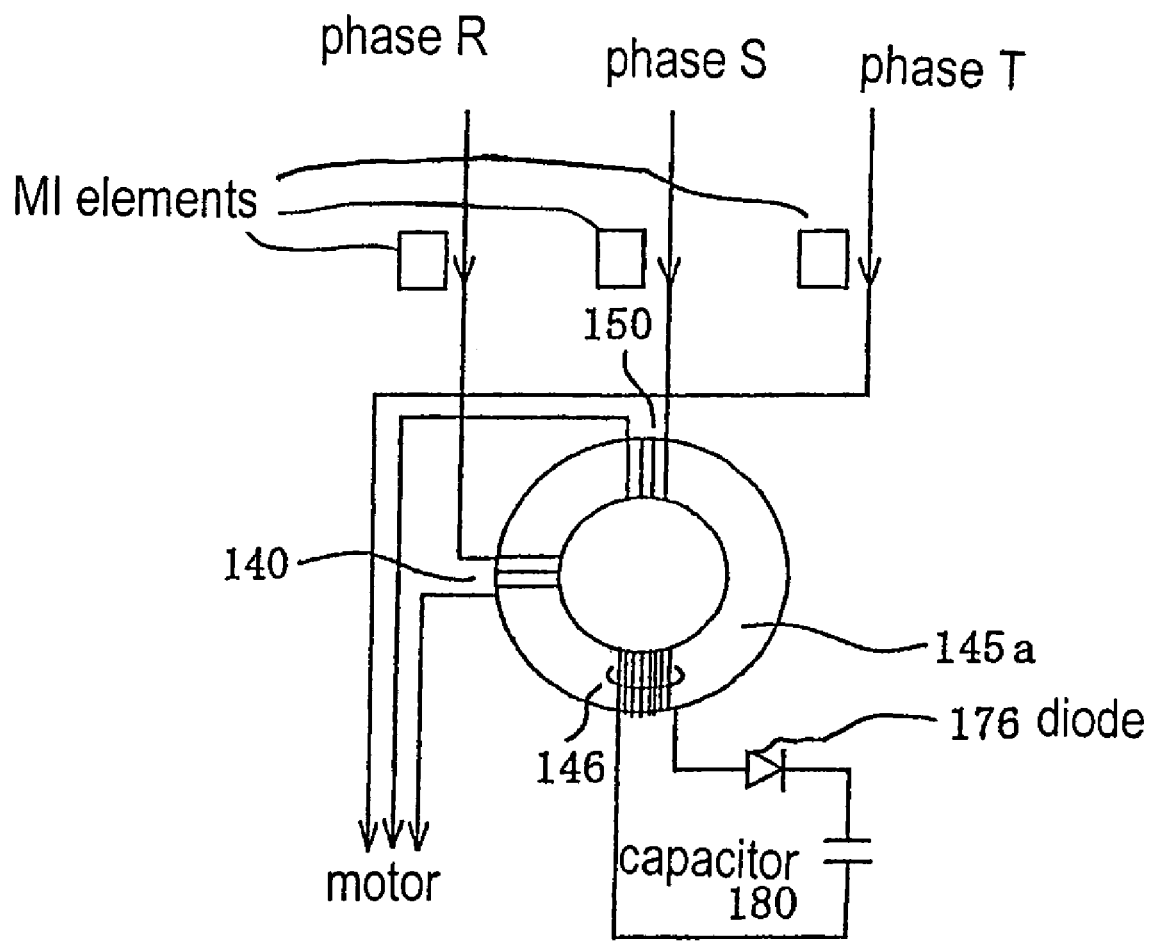
FIG. 10 is a view showing a constitution of a transformer.

The circuit shown in FIG. 1 requires the power-supply transformers 161 and 162 corresponding to at least two phases. On the other hand, the circuit shown in FIG. 9 includes a single core 145 to replace the primary coils 140 and 150 provided for each phase so as to receive power from the secondary coil 146, thereby eliminating one of the two cores. Concretely, as shown in FIG. 10, the core 145 is formed of a toroidal core 145a. A winding ratio between the primary coils 140 and 150 is selected to be, for example, 1:2, so that a proper current level is fed from the secondary coil 146. The winding turns of the primary coils differ among individual phases, because if the winding turns are identical, it is not possible to detect a vacant phase.

In the controlling power-supply source, a first capacitor 180 is linked with the secondary coil 146 via a rectifying diode 176. A protective diode 177 is connected between the anode of the rectifying diode 176 and the ground of the circuit. The first capacitor 180 is connected between the positive input terminal of the voltage adjuster 19 and the ground of the circuit. The second capacitor 181 is connected between the positive output terminal of the voltage adjuster 19 and the ground of the circuit. The voltage adjuster 19 outputs a constant voltage level VCC.

Other components shown in FIG. 9 are identical to those shown in FIG. 1, and descriptions thereof are omitted.

Figure 11:
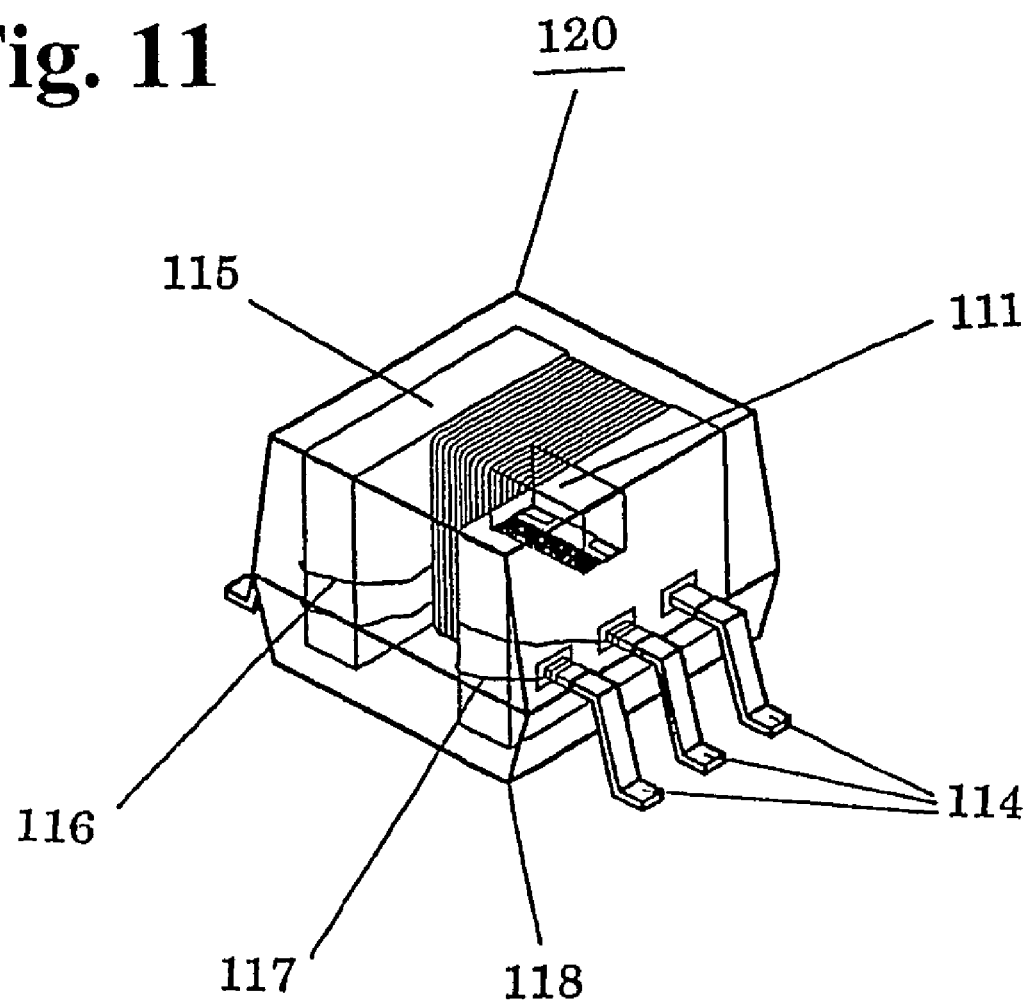
FIG. 11 is a perspective view showing a constitution of a magnetic sensor.

Referring to FIG. 11, a concrete constitution of the magnetic sensor as described above is described below.

In FIG. 11, reference numeral 111 designates a magnetism detection element formed of a thin-film, and reference numeral 115 designates a resinous bobbin formed on an outside surface of the magnetism detection element 111 with an insert-molding process. Reference numeral 116 designates a coil for applying a bias magnetic field to the magnetism detection element 111, reference numeral 117 designates a coil for applying a negative feedback magnetic field to the magnetism detection element 111, and reference numeral 118 designates a resin case for protecting the magnetism detection element 111 and the coils 116 and 117 from environmental hazards formed with an insert-molding process. Reference numeral 114 designates terminals for applying a high-frequency current to both ends of the magnetism detection element 111, and for applying a current to the coils 116 and 117. The entire constitution of the magnetic sensor is designated by reference numeral 120. In the constitution shown in FIG. 11, the coil is provided for applying the negative-feedback magnetic field to the magnetism detection element 111. However, the coil may be omitted.

Figure 12:
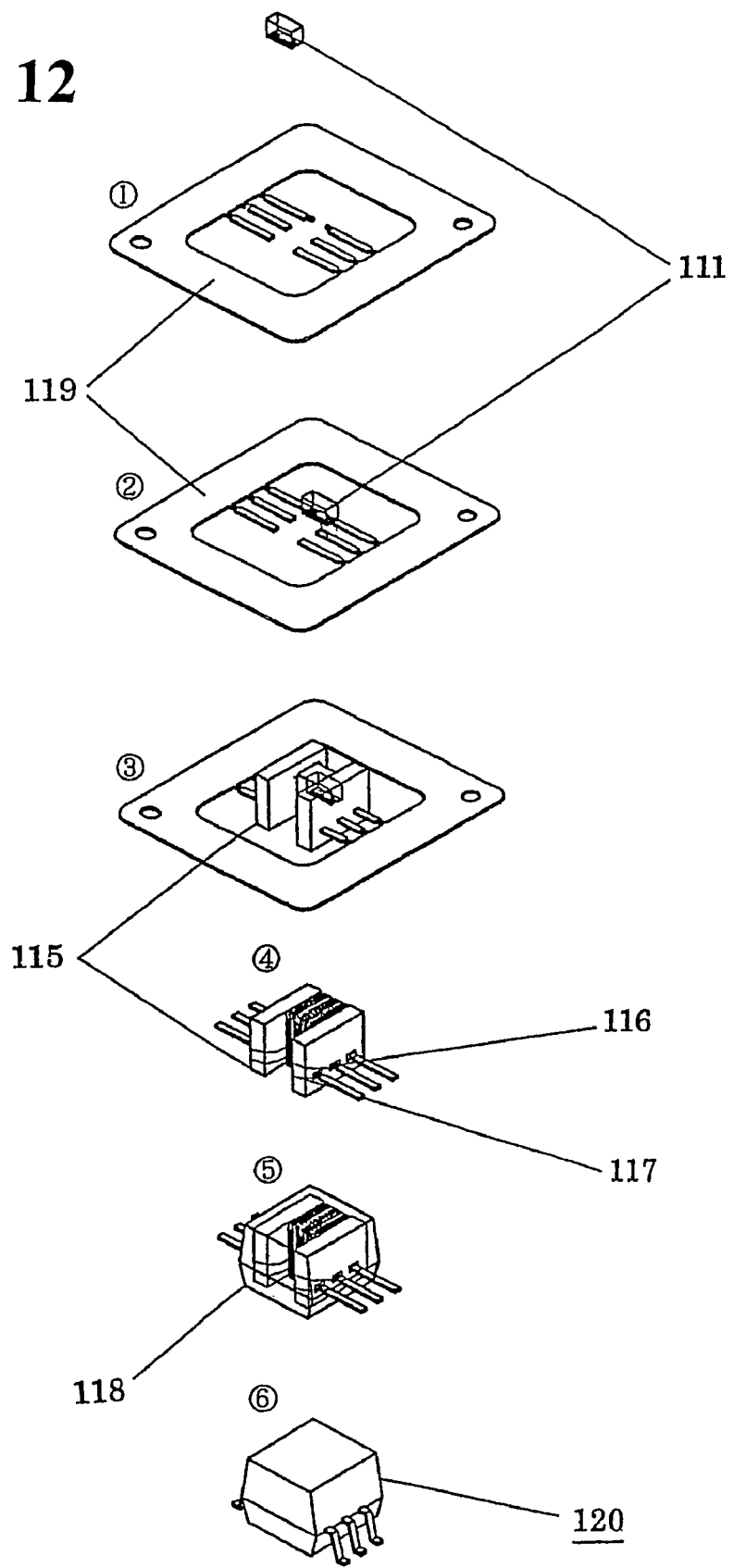
FIG. 12 is an explanatory view showing a process of producing the magnetic sensor shown in FIG. 11.

FIG. 12 is a view showing a process of assembling a magnetic sensor unit. Initially, as shown in (2), a magnetism detection element 111 is bonded between a pair of terminals on the lead frame 119 shown in (1). The bonding method includes a soldering process, an adhesive process, and bonding. Next, as shown in (3), a bobbin 115 is integrally molded with the lead frame 119 with the magnetism detection element 111. Next, as shown in (4), after the lead frame 119 is cut off, a bias coil 116 and a negative feedback coil 117 are wound. Next, as shown in (5), a case 118 is molded directly above the coil unit. Next, as shown in (6), terminals 114 are folded to complete the assembly work.

It is possible to form the thin-film magnetism detection element into a substantially 1 mm square shape. Accordingly, it is possible to form the magnetic sensor 120 into a substantially 5 mm square shape, thereby decreasing the magnetic resistance between the magnetic detection element 111 and the coils 116 and 117.

Figure 13A:
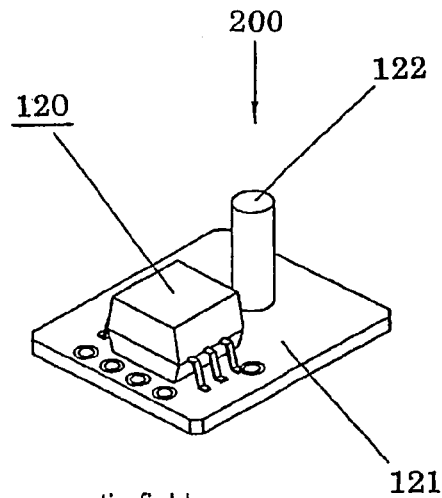
FIG. 13(a)–13(b) is an explanatory view showing an assembled state of the loaded magnetic sensor shown in FIG. 11.
Figure 13B:
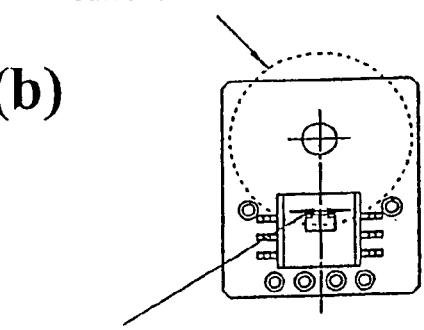

FIG. 13 shows an example of the magnetic sensor in a mounted state, wherein FIG. 13(a) is a perspective view thereof and FIG. 13(b) is a plan view thereof.

As shown in FIG. 13(a), the magnetic sensor 120 is mounted on a substrate 121 having a wiring 122 for connecting a current 200. Due to the arrangement of the magnetic sensor 120 relative to a magnetic flux generated by the current 200 as indicated by hidden line in FIG. 13(b), the output sensitivity of the magnetic sensor 120 is determined. Thus, by considering the arrangement of the magnetic sensor 120, it is possible to adjust the output sensitivity of the magnetic sensor 120.

Figure 14:
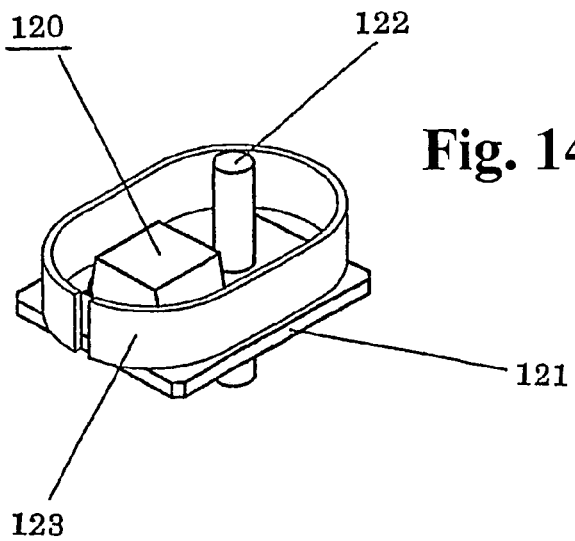
FIG. 14 is an explanatory view showing an example of a magnetic shielding.

FIG. 14 shows an example of a structure of a magnetic shield. A magnetic shield 123 is added to the one shown in FIG. 11. Although the shield has an oval shape here, it is desirable to adjust the shape in correspondence with the magnitude of the current 200. Reference numeral 121 designates a substrate, and reference numeral 122 designates a wiring.

Figure 15:
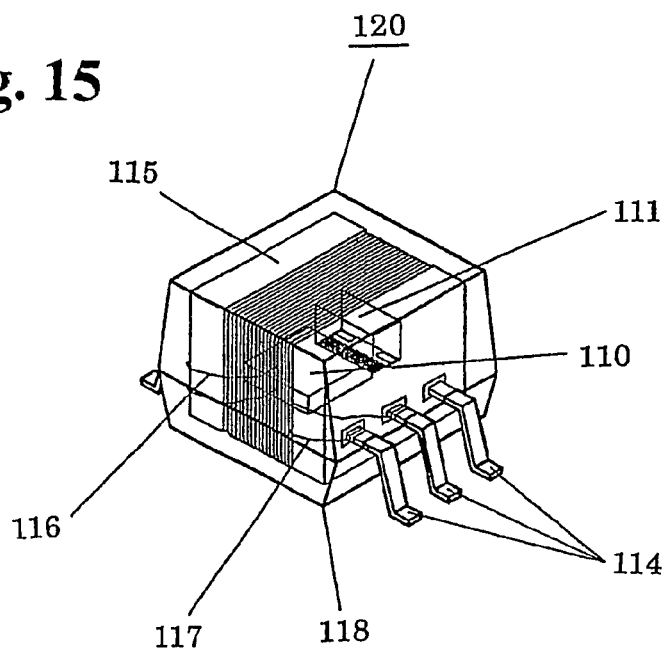
FIG. 15 is a perspective view showing an example of the magnetism detection unit.
Figure 16:
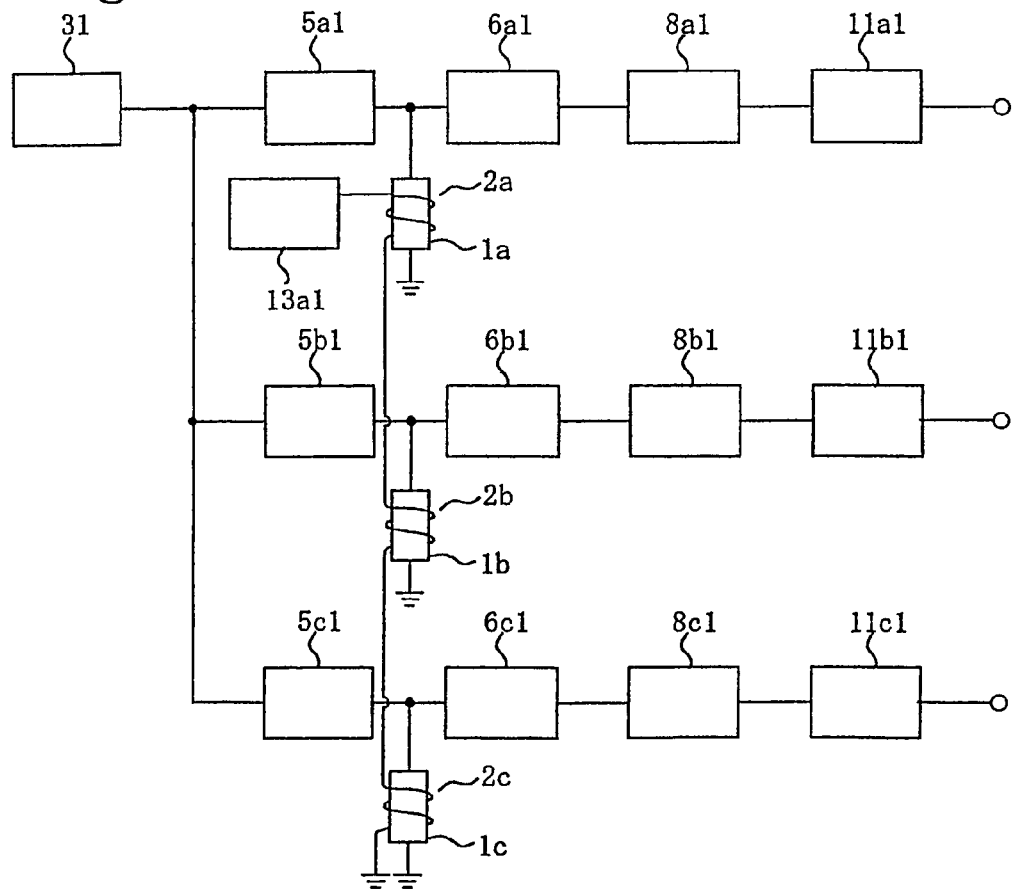
FIG. 16 is a schematic block diagram of a conventional magnetism detection unit.

FIG. 15 is a concrete example of the magnetism detection unit. A detection circuit 110 is incorporated (integrated) into the magnetic sensor unit shown in FIG. 11. With this arrangement, it is possible to enhance the S/N ratio of the sensor signal. By internally storing various types of corrective data used for automatic calibration as described in FIG. 6 for each magnetic sensor element, the precision can be further improved.

INDUSTRIAL APPLICABILITY

The present invention is applicable to the above-described over-current protection device, and is also applicable to general current detection devices for detecting the magnitude of the current flowing through a conductor, or general breakers for breaking the current when the magnitude of the detected current exceeds a pre-determined threshold value.

What is claimed is:

1. An over-current protection device for shutting off power to a load when an overloaded current flows, comprising:
   a switching element for switching a current from a power-supply source to the load,
   a current detector for detecting a current supplied from the power-supply source to the load, and
   a controlling power-supply source for supplying power to each of the switching element and current detector,
   wherein said current detector includes magnetism detection elements having a magnetic impedance effect and corresponding to phases of the power-supply source; AC-current supply means for applying an AC current to each magnetism detection element through one oscillating means and a first switch corresponding to each magnetism detection element; bias-current supply means formed of bias coils wound on the respective magnetism detection elements and a third switch for supplying a current to the bias coils via the third switch; wave detection means corresponding to the magnetism detection elements for converting an impedance variation into a voltage and for passing a peak of the voltage; second switches corresponding to the wave detection means for selecting an output of the wave detection means; holding means for holding the selected voltage of the wave detection means; and amplifying means for amplifying the voltage held by the holding means, and the current for each phase is detected based on selective operations of the first, second, and third switches.

2. An over-current protection device according to claim 1, wherein when said first and second switches corresponding to one of the magnetism detection elements disposed in the power-supply phase are selected, said third switch is selected.

3. An over-current protection device according to claim 1, wherein said oscillating means is operated synchronously with the third switch.

4. An over-current protection device according to claim 1, wherein said controlling power-supply source comprises at least two power-supply transformers having primary and secondary coils and connected to a current-supply line linked between the power-supply line and the load, a capacitor for storing a current at a secondary side, and a voltage adjuster.

5. An over-current protection device according to claim 1, wherein said controlling power-supply source comprises a power-supply transformer having at least two primary coils and one secondary coil and connected to a current-supply line between the power-supply line and the load, a capacitor for storing a current at a secondary side, and a voltage adjuster.

6. An over-current protection device according to claim 5, wherein said at least two primary coils and one secondary coil are wound on a single iron core, and said primary coils have different winding turns for each phase.

7. An over-current protection device according to claim 6, wherein said two primary coils of the power-supply transformers have a winding ratio of 1:2.

8. An over-current protection device according to claim 1, wherein said magnetism detection element, a terminal for applying an AC current to the magnetism detection element, the bias coil, and a terminal for supplying a bias current to the bias coil are integrated with a resin molding process.

9. An over-current protection device according to claim 1, wherein said magnetism detection element, a terminal for supplying an AC current to the magnetism detection element, the bias coil, a terminal for supplying a bias current to the bias coil, and a circuit for outputting a signal proportional to an output of the magnetism detection element are integrated with a resin molding process.

10. An over-current protection device according to claim 1, wherein said magnetism detection element is formed of a thin-film.

* * * * *